(12) United States Patent
Kirita et al.

(10) Patent No.: US 10,892,431 B2
(45) Date of Patent: Jan. 12, 2021

(54) ORGANIC ELECTROLUMINESCENT ELEMENT

(71) Applicant: JOLED INC., Tokyo (JP)

(72) Inventors: Shina Kirita, Tokyo (JP); Takayuki Shimamura, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 16/361,956

(22) Filed: Mar. 22, 2019

(65) Prior Publication Data

US 2019/0305243 A1    Oct. 3, 2019

(30) Foreign Application Priority Data

Mar. 28, 2018  (JP) .................................. 2018-061861

(51) Int. Cl.
*H01L 51/50* (2006.01)
*H01L 51/00* (2006.01)

(52) U.S. Cl.
CPC ...... *H01L 51/5012* (2013.01); *H01L 51/0008* (2013.01); *H01L 2251/303* (2013.01); *H01L 2251/558* (2013.01)

(58) Field of Classification Search
None
See application file for complete search history.

(56) References Cited

U.S. PATENT DOCUMENTS

| 2011/0163339 A1 | 7/2011 | Negishi et al. |
| 2013/0256639 A1* | 10/2013 | Kambe ............... H01L 51/5096 257/40 |
| 2017/0222149 A1 | 8/2017 | Nakadaira et al. |

FOREIGN PATENT DOCUMENTS

| JP | 2010-186637 | 8/2010 |
| JP | 2011-119047 | 6/2011 |
| JP | 2013-207010 | 10/2013 |
| JP | 2013-207167 | 10/2013 |
| WO | 2016/084408 | 6/2016 |

OTHER PUBLICATIONS

Office Action from Japan Patent Office (JPO) in Japanese Patent Appl. No. 2018-061861, dated Jul. 21, 2020.

* cited by examiner

*Primary Examiner* — Moazzam Hossain
*Assistant Examiner* — Stanetta D Isaac
(74) *Attorney, Agent, or Firm* — Greenblum & Bernstein, P.L.C.

(57) ABSTRACT

An organic electroluminescent element includes, in order, a first electrode, an organic layer that includes an organic electroluminescent layer, an interface adjustment layer, a resistive layer, and a second electrode. The resistive layer has a specific resistance higher than a specific resistance of the second electrode. The interface adjustment layer has a specific resistance higher than the specific resistance of the second electrode and lower than the specific resistance of the resistive layer.

9 Claims, 3 Drawing Sheets

ORGANIC ELECTROLUMINESCENT ELEMENT

CROSS REFERENCE TO RELATED APPLICATIONS

This application claims the benefit of Japanese Priority Patent Application No. 2018-061861 filed on Mar. 28, 2018, the entire contents of which are incorporated herein by reference.

BACKGROUND

The disclosure relates to an organic electroluminescent element.

A display unit that includes an organic electroluminescent element has been recently proposed, as disclosed in Japanese Unexamined Patent Application Publication (JP-A) No. 2013-207010, for example.

SUMMARY

There is a general demand for an organic electroluminescent element that suppresses short-circuiting between electrodes caused by foreign matters, such as particles, and projections. However, a typical organic electroluminescent element that includes a resistive layer to suppress the short-circuiting, such as the organic electroluminescent element disclosed in JP-A No. 2013-207010, can experience a significant increase in driving voltage.

It is desirable to provide an organic electroluminescent element that makes it possible to suppress a significant increase in driving voltage while suppressing short-circuiting.

An organic electroluminescent element according to one embodiment of the disclosure includes, in order, a first electrode, an organic layer that includes an organic electroluminescent layer, an interface adjustment layer, a resistive layer, and a second electrode. The resistive layer has a specific resistance higher than a specific resistance of the second electrode. The interface adjustment layer has a specific resistance higher than the specific resistance of the second electrode and lower than the specific resistance of the resistive layer.

BRIEF DESCRIPTION OF THE DRAWINGS

The accompanying drawings are included to provide a further understanding of the disclosure and are incorporated in and constitute a part of this specification. The drawings illustrate example embodiments and, together with the specification, serve to explain the principles of the disclosure.

DETAILED DESCRIPTION

In the following, some example embodiments of the disclosure are described in detail, in the following order, with reference to the accompanying drawings. Note that the following description is directed to illustrative examples of the disclosure and not to be construed as limiting to the disclosure. Factors including, without limitation, numerical values, shapes, materials, components, positions of the components, and how the components are coupled to each other are illustrative only and not to be construed as limiting to the disclosure. Further, elements in the following example embodiments which are not recited in a most-generic independent claim of the disclosure are optional and may be provided on an as-needed basis. The drawings are schematic and are not intended to be drawn to scale.

[Configuration]

Figure 1:
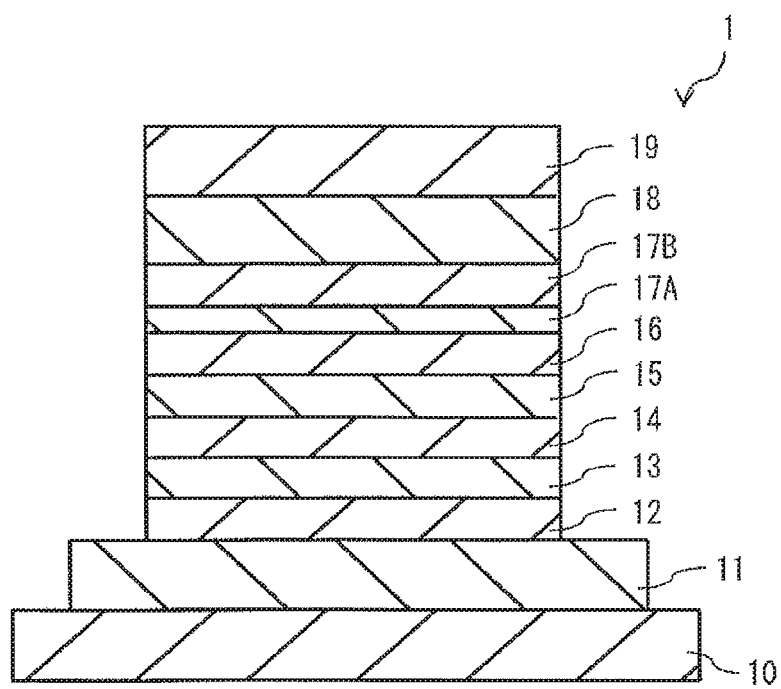
FIG. 1 is a cross-sectional view of an organic electroluminescent element having an example configuration according to one example embodiment of the disclosure.

FIG. 1 is a cross-sectional view of an organic electroluminescent element 1 having an example configuration according to an example embodiment of the disclosure. The organic electroluminescent element 1 may be provided on a substrate 10, for example. The organic electroluminescent element 1 includes an anode 11, an organic layer that includes a light-emitting layer 14, an interface adjustment layer 17A, a resistive layer 17B, and a cathode 18, in this order on the substrate 10, for example. In an example, the organic electroluminescent element 1 may include the anode 11, a hole injection layer 12, a hole transport layer 13, the light-emitting layer 14, an electron transport layer 15, an electron injection layer 16, the interface adjustment layer 17A, the resistive layer 17B, the cathode 18, and a sealing layer 19, in this order on the substrate 10. The anode 11 may correspond to a specific but non-limiting example of a "first electrode" according to one embodiment of the disclosure. The light-emitting layer 14 may correspond to a specific but non-limiting example of an "organic electroluminescent layer" according to one embodiment of the disclosure. The combination of the light-emitting layer 14, the electron transport layer 15, and the electron injection layer 16 may correspond to a specific but non-limiting example of an "organic layer" according to one embodiment of the disclosure. The cathode 18 may correspond to a specific but non-limiting example of a "second electrode" according to one embodiment of the disclosure.

In one example, the substrate 10 may be a transmissive substrate having light transmissivity, such as a transparent substrate. For example, the substrate 10 may be a glass substrate that includes a glass material. In another example, the substrate 10 may be other than the glass substrate and may be a transparent resin substrate that includes a transparent resin material, such as polycarbonate resin or acrylic resin. In a still another example, the substrate 10 may be a thin-film transistor (TFT) substrate serving as a backplane of an organic electroluminescent display unit.

The anode 11 may be provided on the substrate 10, for example. In one example, the anode 11 may be a reflective electrode that includes light-reflective material, such as aluminum (Al), aluminum alloy, platinum (Pt), gold (Au), chromium (Cr), or tungsten (W). In another example, the anode 11 may be other than the reflective electrode and may be a transparent electrode having a light transmissivity. Specific but non-limiting examples of the material of the transparent electrode may include a transparent electrically-conductive material, such as indium tin oxide (ITO) or indium zinc oxide (IZO). In a still another example, the anode 11 may be a laminate of the reflective electrode and the transparent electrode.

The hole injection layer 12 may enhance an efficiency in injecting holes. The hole injection layer 12 may inject holes injected from the anode 11 to the light-emitting layer 14. The hole injection layer 12 may include an oxide of silver (Ag), molybdenum (Mo), chromium (Cr), vanadium (V), tungsten (W), nickel (Ni), or iridium (Ir), or an electrically-conductive polymeric material, such as a mixture of polythiophene and polystyrene sulfonate (PEDOT), for example. The hole injection layer 12 may have a single-layer structure or multi-layer structure.

The hole transport layer 13 may transport holes injected from the anode 11 to the light-emitting layer 14. The hole transport layer 13 may include a hole transporting material that transports holes injected from the anode 11 to the light-emitting layer 14, for example. Specific but non-limiting examples of the hole transporting material may include an arylamine derivative, a triazole derivative, an oxadiazole derivative, an imidazole derivative, a polyarylalkane derivative, a pyrazoline derivative, a pyrazolone derivative, a phenylenediamine derivative, an amino-substituted chalcone derivative, an oxazole derivative, a styryl anthracene derivative, a fluorenone derivative, a hydrazone derivative, a stilbene derivative, a butadiene compound, a polystyrene derivative, a triphenylmethane derivative, a tetraphenylbenzene derivative, or a combination thereof. A difference in highest occupied molecular orbital (HOMO) level between the material of the hole injection layer 12 and the material of the hole transport layer 13 may be 0.5 eV or lower in view of the hole-injection property, for example.

Holes injected from the anode 11 and electrons injected from the cathode 18 are recombined in the light-emitting layer 14 to generate excitons, which may cause the light-emitting layer 14 to emit light. The light-emitting layer 14 may include an organic electroluminescent material, for example.

The organic electroluminescent material of the light-emitting layer 14 may be a mixture of a host material and a dopant material, for example. In one example, the organic electroluminescent material of the light-emitting layer 14 may include a single dopant material. The host material may serve to transport electrons and holes, and the dopant material may serve to emit light. In another example, the organic electroluminescent material of the light-emitting layer 14 may include two or more host materials and two or more dopant materials in combination.

Specific but non-limiting examples of the host material of the light-emitting layer 14 may include an amine compound, a condensed polycyclic aromatic compound, and a heterocyclic compound. Specific but non-limiting examples of the amine compound may include a monoamine derivative, a diamine derivative, a triamine derivative, and a tetraamine derivative. Specific but non-limiting examples of the condensed polycyclic aromatic compound may include an anthracene derivative, a naphthalene derivative, a naphthacene derivative, a phenanthrene derivative, a chrysene derivative, a fluoranthene derivative, a triphenylene derivative, a pentacene derivative, and a perylene derivative. Specific but non-limiting examples of the heterocyclic compound may include a carbazole derivative, a furan derivative, a pyridine derivative, a pyrimidine derivative, a triazine derivative, an imidazole derivative, a pyrazole derivative, a triazole derivative, an oxazole derivative, an oxadiazole derivative, a pyrrole derivative, an indole derivative, an azaindole derivative, an azacarbazole derivative, a pyrazoline derivative, a pyrazolone derivative, and a phthalocyanine derivative.

Specific but non-limiting examples of the dopant material of the light-emitting layer 14 may include a pyrene derivative, a fluoranthene derivative, an arylacetylene derivative, a fluorene derivative, a perylene derivative, an oxadiazole derivative, an anthracene derivative, and a chrysene derivative. The fluorescent dopant material of the light-emitting layer 14 may include a metal complex. Specific but non-limiting examples of the metal complex may include an atom of metal, such as iridium (Ir), platinum (Pt), osmium (Os), gold (Au), rhenium (Re), or ruthenium (Ru), and a ligand.

The electron transport layer 15 may transport electrons injected from the cathode 18 to the light-emitting layer 14. The electron transport layer 15 may include an electron transporting material that transports electrons injected from the the cathode 18 to the light-emitting layer 14. The electron transport layer 15 may have an electric charge blocking property that suppresses tunneling of electric charges (holes) from the light-emitting layer 14 to the cathode 18. The electron transport layer 15 may also have a property that suppresses light extinction of the light-emitting layer 14 in an excited state, for example.

The electron transporting material may include an aromatic heterocyclic compound containing one or more hetero atoms in a molecule, for example. The aromatic heterocyclic compound may contain, as a skeleton, a pyridine ring, a pyrimidine ring, a triazine ring, a benzimidazole ring, a phenanthroline ring, or a quinazoline ring, for example. Optionally, the electron transporting material may be doped with a metal having an electron transporting property. In such a case, the electron transport layer 15 may be an organic electron transport layer containing a doped metal. Such an electron transport layer 15 containing the metal having the electron transporting property exhibits an enhanced electron transporting property.

The electron injection layer 16 may inject electrons injected from the cathode 18 to the electron transport layer 15 and the light-emitting layer 14. The electron injection layer 16 may include an electron injecting material that facilitates injection of electrons from the cathode 18 to the electron transport layer 15 and the light-emitting layer 14, for example. In one example, the electron injecting material may include an organic material that has an electron injecting property and is doped with a metal having the electron injecting property. The metal doped in the electron injection layer 16 may be the same as the metal doped in the electron transport layer 15, for example.

In one example, the cathode 18 may be a transparent electrode, such as an ITO film. In another example, the cathode 18 may be other than the transparent electrode, and may be a reflective electrode having light reflectivity. The reflective electrode may include aluminum (Al), magnesium (Mg), silver (Ag), aluminum-lithium alloy, or magnesium-silver alloy, for example. In an example embodiment in which the substrate 10 and the anode 11 have reflectivity and where the cathode 18 has light transmissivity, the organic electroluminescent element 1 may have a top-emission structure that emits light through the cathode 18. In another embodiment in which the substrate 10 and the anode 11 have light transmissivity and where the cathode 18 has reflectivity, the organic electroluminescent element 1 may have a bottom-emission structure that emits light through the substrate 10.

The sealing layer 19 may be provided on the cathode 18. For example, the sealing layer 19 may be in contact with an upper surface of the cathode 18. The sealing layer 19 may include a resin material, for example. The resin material of the sealing layer 19 may include epoxy resin or vinyl resin, for example. Alternatively, the sealing layer 19 may include silicon nitride ($SiN_x$), silicon oxide ($SiO_x$), or silicon oxynitride (SiON), for example. Still alternatively, the sealing layer 19 may have a multi-layer structure that includes the layer including a resin material and a layer including SiNx, SiOx, or SiON, for example.

The interface adjustment layer 17A and the resistive layer 17B will now be described.

The resistive layer 17B may suppress short-circuiting between the anode 11 and the cathode 18 caused by foreign matters, such as particles, and projections. The interface adjustment layer 17A may be in contact with a surface, adjacent to the anode 11, of the resistive layer 17B. The interface adjustment layer 17A may suppress an increase in driving voltage due to an interfacial barrier generated by a difference in electron level between the electron injection layer 16 and the resistive layer 17B.

The interface adjustment layer 17A and the resistive layer 17B may each include a material having light transmissivity to light emitted from the light-emitting layer 14. The interface adjustment layer 17A and the resistive layer 17B may include the same material which may be an oxide semiconductor, for example. Specific but non-limiting examples of the oxide semiconductor included in the interface adjustment layer 17A and the resistive layer 17B may include niobium oxide ($Nb_2O_5$), titanium oxide ($TiO_2$), molybdenum oxide ($MoO_2$ or $MoO_3$), tantalum oxide ($Ta_2O_5$), a mixture of niobium oxide and titanium oxide, a mixture of titanium oxide and zinc oxide (ZnO), a mixture of silicon oxide ($SiO_2$) and tin oxide ($SnO_2$), and any combination of two or more thereof.

The resistive layer 17B may have a resistance higher than the resistance of the cathode 18. The interface adjustment layer 17A may have a resistance higher than the resistance of the cathode 18 and lower than the resistance of the resistive layer 17B.

The resistive layer 17B has a specific resistance higher than the specific resistance of the cathode 18. The interface adjustment layer 17A has a specific resistance higher than the specific resistance of the cathode 18 and lower than the specific resistance of the resistive layer 17B. The resistive layer 17B may include a material having a specific resistance of $1\times10^4$ Ω·cm or higher and $5\times10^6$ Ω·cm or lower. In other words, the interface adjustment layer 17A may include a material having a specific resistance lower than $1\times10^4$ Ω·cm. To effectively suppress an increase in driving current, the interface adjustment layer 17A may include a material having a specific resistance lower than $1\times10^3$ Ω·cm, for example. To suppress light absorption by the interface adjustment layer 17A, the interface adjustment layer 17A may have a specific resistance of $1\times10^3$ Ω·cm or higher and lower than $1\times10^4$ Ω·cm, for example. The specific resistance of the interface adjustment layer 17A may be determined in accordance with the specifications expected to be satisfied by the organic electroluminescent element 1. Note that the cathode 18 may include a material having a specific resistance of $1\times10^{-4}$ Ω·cm or higher and $1\times10^3$ Ω·cm or lower.

The interface adjustment layer 17A may be thinner in view of the light absorption of the interface adjustment layer 17A. For example, the interface adjustment layer 17A may have a thickness of 3 nm or greater and 100 nm or smaller. The resistive layer 17B may be thick enough to suppress short-circuiting, and have a thickness of 30 nm or greater to 1000 nm or smaller, for example. In the example embodiment, the interface adjustment layer 17A may be thinner than the resistive layer 17B.

Figure 2:
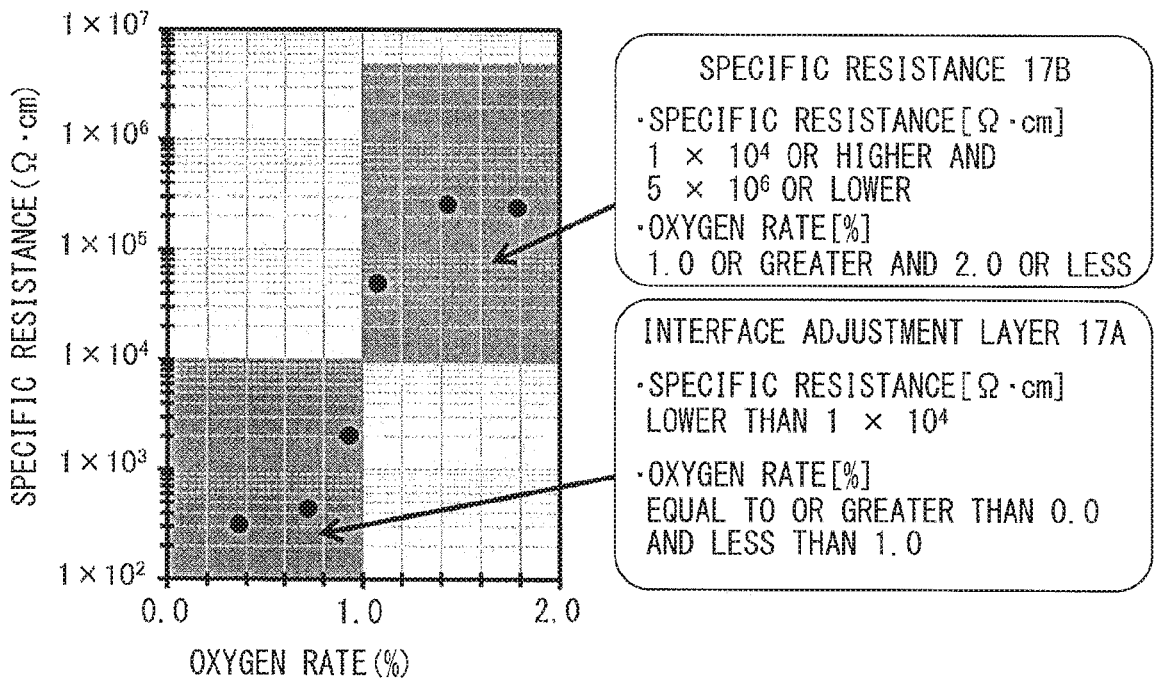
FIG. 2 is a chart illustrating an example relation between an oxygen rate in a sputtering process and a specific resistance of niobium oxide formed in the sputtering process.

The interface adjustment layer 17A and the resistive layer 17B may be manufactured by a sputtering process at a different oxygen rate, for example. For example, the resistive layer 17B having a specific resistance of $1\times10^4$ Ω·cm or higher and $5\times10^6$ Ω·cm or lower may be formed by the sputtering process at an oxygen rate of 1.0% or greater and 2.0% or less, as illustrated in a gray zone on an upper right of FIG. 2, for example. The interface adjustment layer 17A having a specific resistance lower than $1\times10^4$ Ω·cm may be formed by the sputtering process at an oxygen rate equal to or greater than 0.0% and less than 1.0%, as illustrated in a gray zone on a lower left of FIG. 2, for example. Note that FIG. 2 illustrates an example relation between the oxygen rate in the sputtering process and the specific resistance of niobium oxide formed in the sputtering process.

For example, the interface adjustment layer 17A having a specific resistance of $1\times10^3$ Ω·cm or higher and lower than $1\times10^4$ Ω·cm may be formed by the sputtering process at a predetermined oxygen rate which may be 0.8% or greater and less than 1.0%, for example. The interface adjustment layer 17A having a specific resistance lower than $1\times10^3$ Ω·cm may be formed by the sputtering process at a predetermined oxygen rate which may be 0.0% or greater and less than 0.8%, for example.

[Example Effects]

Some example effects of the organic electroluminescent element 1 according to an example embodiment of the disclosure will now be described.

Figure 3:
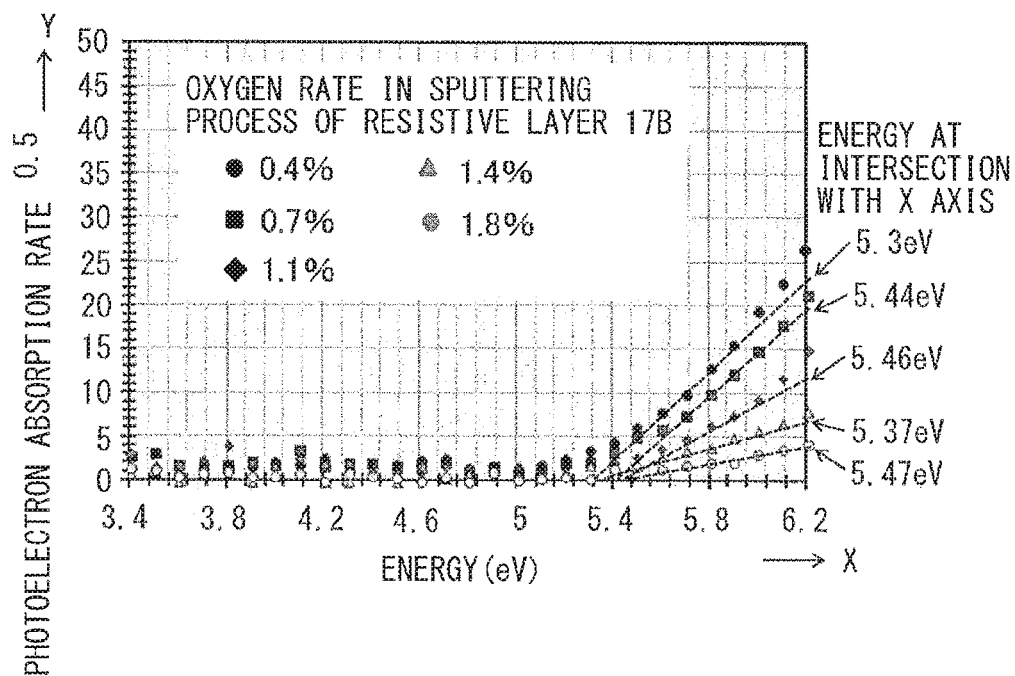
FIG. 3 is a chart illustrating an example relation between energy and photoelectron absorption rate.

There is a general demand for the organic electroluminescent element that suppresses short-circuiting between electrodes caused by foreign matters, such as particles, and projections. However, a typical organic electroluminescent element that includes a resistive layer to suppress the short-circuiting, such as the organic electroluminescent element disclosed in JP-A No. 2013-207010, can generate a difference of 2.0 eV or greater in electron level between the electron injection layer and the resistive layer. This can increase a driving voltage to 6 volts or higher due to the interfacial barrier between the electron injection layer and the resistive layer. Note that the wording "difference in electron level" between the electron injection layer and the resistive layer used herein refers to a difference in work function between the electron injection layer and the resistive layer. In this example embodiment, the work function may be represented by the mathematical function $y^{0.5}=x$ where x denotes energy and y denotes a photoelectron absorption rate. The mathematical function is represented by FIG. 3 having an x-axis and a $y^{0.5}$-axis. The work function may correspond to an x value at an intersection between the x-axis and each of connecting lines. The connecting lines illustrated in FIG. 3 represent respective cases in which the oxygen rates are 0.4%, 0.7%, 1.1%, 1.4%, and 1.8% in the sputtering process. Additionally, energy of 5.3 eV, 5.44 eV, 5.46 eV, 5.37 eV, and 5.47 eV are illustrated in FIG. 3 at respective intersections between the connecting lines and the x-axis. When the work function of the electron injection layer 16 is 2.6 eV, the difference in electron level between the electron injection layer 16 and the resistive layer 17B is 2 eV or greater: For example, the different in electron level may be 2.7 eV, 2.84 eV, 2.86 eV, 2.77 eV, or 2.87 eV.

According to the example embodiment of the disclosure, the resistive layer 17B is provided between the electron injection layer 16 and the cathode 18. The resistive layer 17B has a resistance higher than the resistance of the cathode 18. This suppresses short-circuiting between the anode 11 and the cathode 18 caused by foreign matters, such as particles, and projections, but at the same time generates a difference in electron level of 2.0 eV or greater between the electron injection layer 16 and the resistive layer 17B, as in the organic electroluminescent element disclosed in JP-A No. 2013-207010. However, in the example embodiment of the disclosure, an increase in driving voltage due to the interfacial barrier generated by the difference in electron level between the electron injection layer 16 and the resistive layer 17B is mitigated by the interface adjustment layer 17A that is provided between the electron injection layer 16 and the resistive layer 17B and has a resistance higher than the resistance of the cathode 18 and lower than the resistance of the resistive layer 17B.

Figure 4:
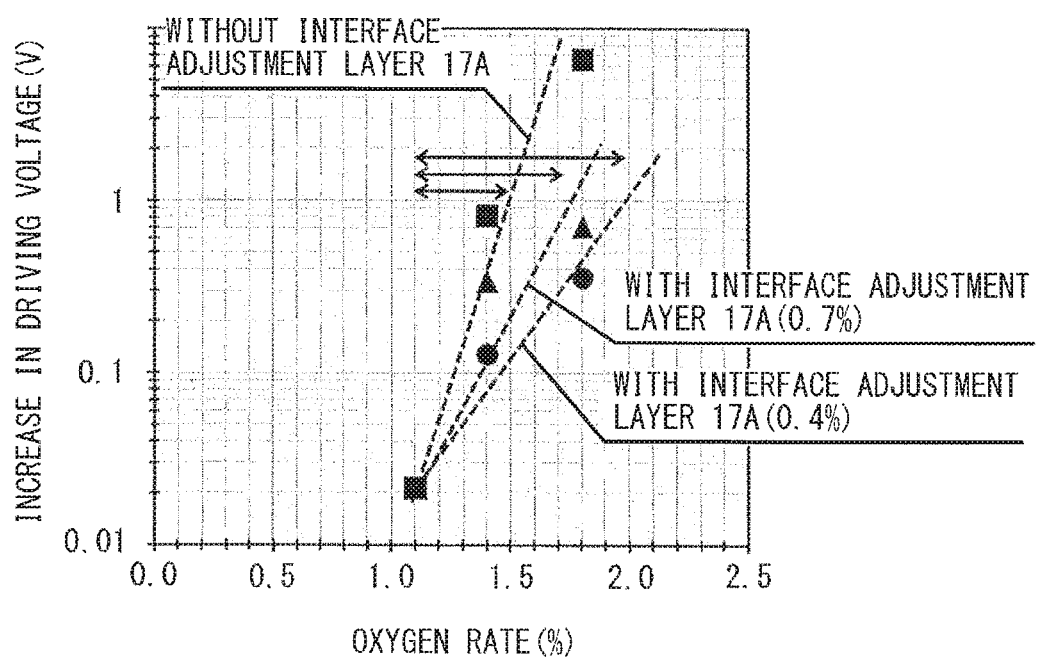
FIG. 4 is a chart illustrating an example relation between an oxygen rate in the sputtering process and an increased amount of driving voltage.

FIG. 4 illustrates an example relation between the oxygen rate in the sputtering process and an increased amount of the driving voltage. It is apparent from FIG. 4 that the driving voltage is increased by about 1 volt in a condition where the interface adjustment layer 17A is not formed and where the resistive layer 17B is formed by the sputtering process at an oxygen rate of 1.4%, compared with a condition where the interface adjustment layer 17A and the resistive layer 17B are not formed. It is also apparent from FIG. 4 that the driving voltage is increased by as much as about 6.7 volts in a condition where the interface adjustment layer 17A is not formed and where the resistive layer 17B is formed by the sputtering process at an oxygen rate of 1.8%, compared with the condition where the interface adjustment layer 17A and the resistive layer 17B are not formed.

It is also apparent from FIG. 4 that the driving voltage is increased only by about 0.13 volts in a condition where the interface adjustment layer 17A is formed by the sputtering process at an oxygen rate of 0.4% and where the resistive layer 17B is formed by the sputtering process at an oxygen rate of 1.4%, compared with the condition where the interface adjustment layer 17A and the resistive layer 17B are not formed. It is also apparent from FIG. 4 that the driving voltage is increased only by about 0.36 volts in a condition where the interface adjustment layer 17A is formed by the sputtering process at an oxygen rate of 0.4% and where the resistive layer 17B is formed by the sputtering process at an oxygen rate of 1.8%, compared with the condition where the interface adjustment layer 17A and the resistive layer 17B are not formed.

It is also apparent from FIG. 4 that the driving voltage is increased only by about 0.34 volts in a condition where the interface adjustment layer 17A is formed by the sputtering process at an oxygen rate of 0.7% and where the resistive layer 17B is formed by the sputtering process at an oxygen rate of 1.4%, compared with the condition where the interface adjustment layer 17A and the resistive layer 17B are not formed. It is also apparent from FIG. 4 that the driving voltage is increased only by about 0.71 volts in a condition where the interface adjustment layer 17A is formed by the sputtering process at an oxygen rate of 0.7% and where the resistive layer 17B is formed by the sputtering process at an oxygen rate of 1.8%, compared with the condition where the interface adjustment layer 17A and the resistive layer 17B are not formed.

As described above, according to the example embodiment of the disclosure, the interface adjustment layer 17A mitigates an increase in driving voltage caused by the resistive layer 17B. Accordingly, it is possible to suppress a significant increase in driving voltage while suppressing short-circuiting.

Described below is a range of the oxygen rate during the formation of the resistive layer 17B by the sputtering process. To control an increase in driving voltage at a level of 1 volt or lower without forming the interface adjustment layer 17A, the oxygen rate during the formation of the resistive layer 17B by the sputtering process may be within a range from 1.1% to 1.5%, as illustrated in FIG. 4. On the other hand, to control an increase in driving voltage at a level of 1 volt or lower with forming the interface adjustment layer 17A by the sputtering process at an oxygen rate of 0.4%, the oxygen rate during the formation of the resistive layer 17B by the sputtering process may be within a range from 1.1% to 2.0%, as illustrated in FIG. 4. In addition, to control an increase in driving voltage at a level of 1 volt or lower with forming the interface adjustment layer 17A by the sputtering process at an oxygen rate of 0.7%, the oxygen rate during the formation of the resistive layer 17B by the sputtering process may be within a range from 1.1% to 1.75%, as illustrated in FIG. 4.

As described above, according to the foregoing example embodiment of the disclosure, the range of the oxygen rate in which an increase in driving voltage is controlled at a level of 1 volt or less is successfully enlarged when the interface adjustment layer 17A and the resistive layer 17B are formed by the sputtering process, compared with when the interface adjustment layer 17A is not formed.

Additionally, according to the foregoing example embodiment of the disclosure, the resistive layer 17B may include a material having a specific resistance of $1 \times 10^4$ Ω·cm or higher and $5 \times 10^6$ Ω·cm or lower, and the interface adjustment layer 17A may include a material having a specific resistance lower than $1 \times 10^4$ Ω·cm. This suppresses a significant increase in driving voltage due to the interfacial barrier generated by the difference in electron level between the electron injection layer 16 and the resistive layer 17B. Accordingly, it is possible to suppress a significant increase in driving voltage while suppressing short-circuiting.

Moreover, according to the foregoing example embodiment of the disclosure, the resistive layer 17B may include a material having a specific resistance of $1 \times 10^4$ Ω·cm or higher and $5 \times 10^6$ Ω·cm or lower, and the interface adjustment layer 17A may include a material having a specific resistance of $1 \times 10^3$ Ω·cm or higher and lower than $1 \times 10^4$ Ω·cm. This suppresses light absorption by the interface adjustment layer 17A while suppressing an increase in driving voltage due to the interfacial barrier generated by the difference in electron level between the electron injection layer 16 and the resistive layer 17B. Accordingly, it is possible to suppress an increase in driving voltage and light absorption while suppressing short-circuiting.

Further, according to the foregoing example embodiment of the disclosure, the cathode 18 may include a material having a specific resistance of $1 \times 10^4$ Ω·cm or higher and $1 \times 10^3$ Ω·cm or lower. Accordingly, even when a voltage is applied to each of the multiple organic electroluminescent elements 1 arranged in matrix through the respective cathodes 18, for example, a decrease in voltage caused by the cathode 18 is suppressed. As the decrease in voltage is suppressed, a margin of the voltages applied to the cathodes 18 becomes smaller, and an increase in voltage applied to the cathode 18 is suppressed.

Furthermore, according to the foregoing example embodiment of the disclosure, the interface adjustment layer 17A may have a thickness of 3 nm or greater and 100 nm or smaller. This suppresses light absorption by the interface adjustment layer 17A while suppressing an increase in driving voltage due to the interfacial barrier generated by the difference in electron level between the electron injection layer 16 and the resistive layer 17B. Accordingly, it is possible to suppress an increase in driving voltage and light absorption while suppressing short-circuiting.

Furthermore, according to the foregoing example embodiment of the disclosure, both of the interface adjustment layer 17A and the resistive layer 17B may include niobium oxide, titanium oxide, or a mixture thereof. This facilitates the control of the specific resistance relative to the oxygen rate in the sputtering process.

Although the disclosure is described with reference to the example embodiments hereinabove, these example embodiments are not to be construed as limiting the scope of the disclosure and may be modified in a wide variety of ways. It should be appreciated that the effects described herein are mere examples. Effects of the example embodiments of the disclosure are not limited to those described herein, and may be different from those described herein. The disclosure may further include any effects other than those described herein.

It is possible to achieve at least the following configurations from the foregoing example embodiments of the disclosure.

(1) An organic electroluminescent element including, in order:
  a first electrode;
  an organic layer that includes an organic electroluminescent layer;
  an interface adjustment layer;
  a resistive layer; and
  a second electrode,
  the resistive layer having a specific resistance higher than a specific resistance of the second electrode,
  the interface adjustment layer having a specific resistance higher than the specific resistance of the second electrode and lower than the specific resistance of the resistive layer.
(2) The organic electroluminescent element according to (1), in which
  the resistive layer includes a material having a specific resistance of $1 \times 10^4$ $\Omega \cdot cm$ or higher and $5 \times 10^6$ $\Omega \cdot cm$ or lower, and
  the interface adjustment layer includes a material having a specific resistance lower than $1 \times 10^4$ $\Omega \cdot cm$.
(3) The organic electroluminescent element according to (1), in which the resistive layer includes a material having a specific resistance of $1 \times 10^4$ $\Omega \cdot cm$ or higher and $5 \times 10^6$ $\Omega \cdot cm$ or lower, and
  the interface adjustment layer includes a material having a specific resistance of $1 \times 10^3$ $\Omega \cdot cm$ or higher and lower than $1 \times 10^4$ $\Omega \cdot cm$.
(4) The organic electroluminescent element according to any one of (1) to (3), in which the second electrode includes a material having a specific resistance of $1 \times 10^{-4}$ $\Omega \cdot cm$ or higher and $1 \times 10^3$ $\Omega \cdot cm$ or lower.
(5) The organic electroluminescent element according to any one of (1) to (4), in which the interface adjustment layer has a thickness of 3 nm or greater and 100 nm or smaller.
(6) The organic electroluminescent element according to any one of (1) to (5), in which
  the interface adjustment layer includes any one of niobium oxide, titanium oxide, molybdenum oxide, tantalum oxide, a mixture of niobium oxide and titanium oxide, a mixture of titanium oxide and zinc oxide, a mixture of silicon oxide and tin oxide, or a combination of two or more thereof, and
  the resistive layer includes any one of niobium oxide, titanium oxide, molybdenum oxide, tantalum oxide, a mixture of niobium oxide and titanium oxide, a mixture of titanium oxide and zinc oxide, a mixture of silicon oxide and tin oxide, or a combination of two or more thereof.
(7) The organic electroluminescent element according to any one of (1) to (5), in which
  the interface adjustment layer includes any one of niobium oxide, titanium oxide, or a mixture thereof, and
  the resistive layer includes any one of niobium oxide, titanium oxide, or a mixture thereof.
(8) The organic electroluminescent element according to any one of (1) to (7), in which a material of the interface adjustment layer and a material of the resistive layer are same as each other.

An organic electroluminescent element according to an example embodiment of the disclosure includes the interface adjustment layer and the resistive layer between the organic layer and the second electrode in this order from the organic layer. The resistive layer has a specific resistance higher than the specific resistance of the second electrode. The interface adjustment layer has a specific resistance higher than the specific resistance of the second electrode and lower than the specific resistance of the resistive layer. This suppresses short-circuiting between the first electrode and the second electrode caused by foreign matters, such as particles, and projections. Additionally, the interface adjustment layer 17A mitigates an increase in driving voltage due to the interfacial barrier generated by the difference in electron level between the organic layer and the resistive layer.

An organic electroluminescent element according to an example embodiment of the disclosure includes the interface adjustment layer and the resistive layer between the organic layer and the second electrode in this order from the organic layer. This suppresses a significant increase in driving voltage while suppressing short-circuiting. It should be understood that effects of the example embodiments of the disclosure are not limited to those described hereinabove, and may be any effect described herein.

Although the disclosure is described hereinabove in terms of example embodiments, it is not limited thereto. It should be appreciated that variations may be made in the example embodiments described herein by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the use of the terms first, second, etc. do not denote any order or importance, but rather the terms first, second, etc., are used to distinguish one element from another. The term "disposed on/provided on/formed on" and its variants as used herein refer to elements disposed directly in contact with each other or indirectly by having intervening structures therebetween. Moreover, no element or component in this disclosure is intended to be dedicated to the public regardless of whether the element or component is explicitly recited in the following claims.

What is claimed is:

1. An organic electroluminescent element comprising, in order:
  a first electrode;
  an organic layer that includes an organic electroluminescent layer;
  an electron injection layer doped with a metal and configured to facilitate injection of electrons to the organic electroluminescent layer,
  an interface adjustment layer;
  a resistive layer; and
  a second electrode,
  wherein the resistive layer includes a specific resistance higher than a specific resistance of the second electrode, the interface adjustment layer includes a specific resistance higher than the specific resistance of the second electrode and lower than the specific resistance of the resistive layer, and the interface adjustment layer is in direct contact with the electron injection layer.

2. The organic electroluminescent element according to claim 1, wherein the resistive layer includes a material having a specific resistance of $1 \times 10^4$ Ω·cm or higher and $5 \times 10^6$ Ω·cm or lower, and the interface adjustment layer includes a material having a specific resistance lower than $1 \times 10^4$ Ω·cm.

3. The organic electroluminescent element according to claim 1, wherein the resistive layer includes a material having a specific resistance of $1 \times 10^4$ Ω·cm or higher and $5 \times 10^6$ Ω·cm or lower, and the interface adjustment layer includes a material having a specific resistance of $1 \times 10^3$ Ω·cm or higher and lower than $1 \times 10^4$ Ω·cm.

4. The organic electroluminescent element according to claim 1, wherein the second electrode includes a material having a specific resistance of $1 \times 10^{-4}$ Ω·cm or higher and $1 \times 10^3$ Ω·cm or lower.

5. The organic electroluminescent element according to claim 1, wherein the interface adjustment layer has a thickness of 3 nm or greater and 100 nm or smaller.

6. The organic electroluminescent element according to claim 1, wherein the interface adjustment layer includes any one of niobium oxide, titanium oxide, molybdenum oxide, tantalum oxide, a mixture of niobium oxide and titanium oxide, a mixture of titanium oxide and zinc oxide, a mixture of silicon oxide and tin oxide, or a combination of two or more thereof, and the resistive layer includes any one of niobium oxide, titanium oxide, molybdenum oxide, tantalum oxide, a mixture of niobium oxide and titanium oxide, a mixture of titanium oxide and zinc oxide, a mixture of silicon oxide and tin oxide, or a combination of two or more thereof.

7. The organic electroluminescent element according to claim 1, wherein the interface adjustment layer includes any one of niobium oxide, titanium oxide, or a mixture thereof, and the resistive layer includes any one of niobium oxide, titanium oxide, or a mixture thereof.

8. The organic electroluminescent element according to claim 1, wherein a material of the interface adjustment layer and a material of the resistive layer are same as each other.

9. The organic electroluminescent element according to claim 1, wherein a difference in electron energy level between the electron injection layer and the resistive layer is equal to or greater than 2.0 eV.

* * * * *